(12) United States Patent
Oka

(10) Patent No.: US 7,782,696 B2
(45) Date of Patent: Aug. 24, 2010

(54) SEMICONDUCTOR STORAGE DEVICE

(75) Inventor: Yutaka Oka, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 118 days.

(21) Appl. No.: 12/136,830

(22) Filed: Jun. 11, 2008

(65) Prior Publication Data
US 2009/0027985 A1 Jan. 29, 2009

(30) Foreign Application Priority Data
Jul. 25, 2007 (JP) ............... 2007-193649

(51) Int. Cl.
G11C 7/00 (2006.01)
(52) U.S. Cl. ............... 365/205; 365/189.011; 365/207; 365/190
(58) Field of Classification Search ........... 365/205, 365/189.11, 207, 189.09, 190–191
See application file for complete search history.

(56) References Cited

U.S. PATENT DOCUMENTS 6,169,701 B1 * 1/2001 Eto et al. ............... 365/230.06

6,333,883 B2 * 12/2001 Wakayama et al. ......... 365/205

FOREIGN PATENT DOCUMENTS

JP 2003-168294 6/2003

* cited by examiner

Primary Examiner—David Lam
(74) Attorney, Agent, or Firm—Studebaker & Brackett PC; Donald R. Studebaker

(57) ABSTRACT

The semiconductor storage device according to the present invention comprises a switch provided to a bit line between a memory cells and a sense amplifier and capable of continuously varying a degree of conduction; and a switch control circuit for varying the degree of conduction of the switch in accordance with an access request signal. The semiconductor storage device of the present invention enables operation in which the degree of conduction between the sense amplifier and a memory cell is increased, and an ON state is achieved during a time in which the sense amplifier amplifies the holding voltage of the memory cell and feeds the amplified holding voltage to the bit line. The access time can thereby be reduced.

3 Claims, 10 Drawing Sheets

SEMICONDUCTOR STORAGE DEVICE

BACKGROUND OF THE INVENTION

1. Field of the Invention

The present invention relates to a semiconductor storage device such as dynamic random access memory (DRAM) in which a plurality of capacitor-type memory cells forms a memory cell array.

2. Description of the Related Art

FIG. 1 shows a circuit structure of a conventional semiconductor storage device. As shown in FIG. 1, bit information is held in memory cells ML and MR in a DRAM semiconductor storage device. In a RAS (Row Address Strobe) operation in this semiconductor storage device, the level of a selected word line, e.g., WL1, is set to a VPP ("high") level, and a charge is discharged to a bit line BL from the memory cell MR that is connected to the word line WL1. In this case, a relatively large potential difference $\Delta V$ must be created by the discharged charge between the bit line BL and a bit line BLb in order for the potential difference $\Delta V$ to be detected by a sense amplifier SA. An example of a known method for achieving this involves using a transfer gate TG1 to temporarily break the connection between the sense amplifier SA and the memory cell ML on the side of the word line WL0 that was not selected.

However, due to the load capacitance of the bit line BL connected to the memory cell across the transfer gate TG2, when the sense amplifier performs a sensing operation and amplifies $\Delta V$, problems occur in that time is required for the bit line BL to be set to the VDDA (bit information retention potential) level, and for the bit line BLb to be set to the VSS (ground) level. The peak current is also increased by charging and discharging of the bit line BL at the time of sense latching, the sense amplifier power supply cannot adapt, and there is a precipitous drop from the VDDA level as the power supply voltage that must be supplied. For example, as shown in FIG. 2, the potential of the sense amplifier power supply SLP falls from the VDDA level at the start of sense latching.

A method for addressing these problems involves setting a TGR signal inputted to the transfer gate on the side of the memory cell MR to the VDDA level only at the start of sense latching, whereby the transfer gate TG2 connected to the memory cell MR is placed in the OFF state, and the load capacitance on the side of the memory cell MR is withdrawn from the sense amplifier SA only at the start of sense latching. The potential of the bit line BL on the side of the sense amplifier across the transfer gate TG2 is thereby rapidly amplified to the VDDA level. A technique similar to this method is disclosed in Japanese Laid-open Patent Application No. 2003-168294.

However, as the load capacitance of memory cells has decreased in conjunction with recent process refinement and increased memory capacity, the number of memory cells to be connected to the bit lines has increased. Under these circumstances, the sense amplifier power supply cannot adapt to the peak current due to charging and discharging of the bit lines, and there is a more severe drop in the supplied power supply voltage. These problems result in increased amplification time of the sense amplifier, and access times are becoming difficult to reduce.

The present invention was contrived in view of the problems described above, and an object of the present invention is to provide a semiconductor storage device in which the access time can be reduced even when the process is refined and the memory capacity is increased.

SUMMARY OF THE INVENTION

The semiconductor storage device according to the present invention comprises at least one bit line; a plurality of memory cells connected to the bit line and each supplying a holding potential of the memory cells to the bit line; and a sense amplifier connected to the bit line, for amplifying the holding potential and feeding the amplified holding potential to the bit line; wherein the semiconductor storage device further comprises a switch provided to the bit line between the memory cells and the sense amplifier and capable of continuously varying a degree of conduction; and a switch control circuit for varying the degree of conduction of the switch in accordance with an access request signal.

The semiconductor storage device of the present invention enables operation in which the degree of conduction between the sense amplifier and a memory cell is increased, and an ON state is achieved during a time in which the sense amplifier amplifies the holding voltage of the memory cell and feeds the amplified holding voltage to the bit line. The access time can thereby be reduced.

DESCRIPTION OF THE PREFERRED EMBODIMENTS

Embodiments of the present invention will be described in detail with reference to the accompanying drawings. In the following description, transistors indicated by the reference symbol "nmos" are NMOS transistors, and transistors indicated by the reference symbol "pmos" are PMOS transistors.

The First Embodiment

Figure 1:
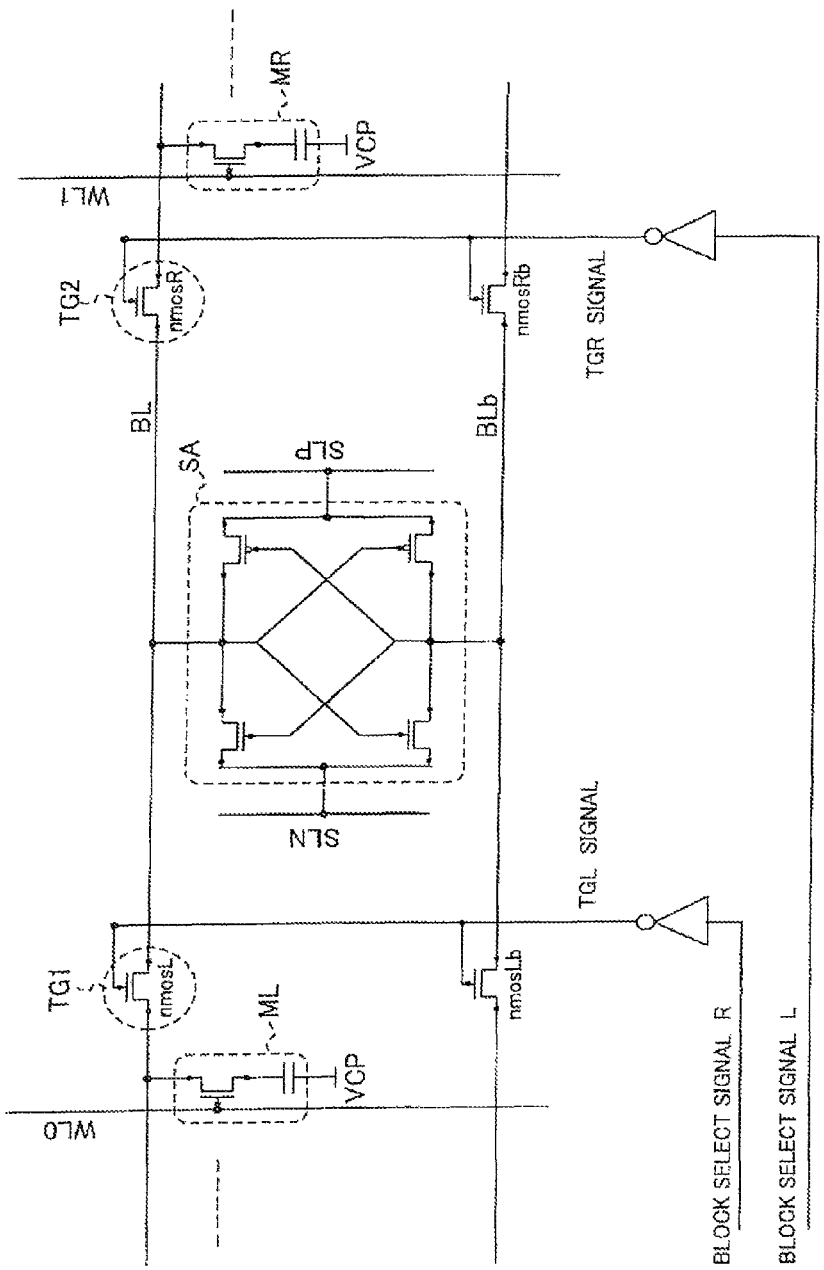
FIG. 1 is a block diagram showing the circuit structure of a conventional semiconductor storage device.
Figure 2:
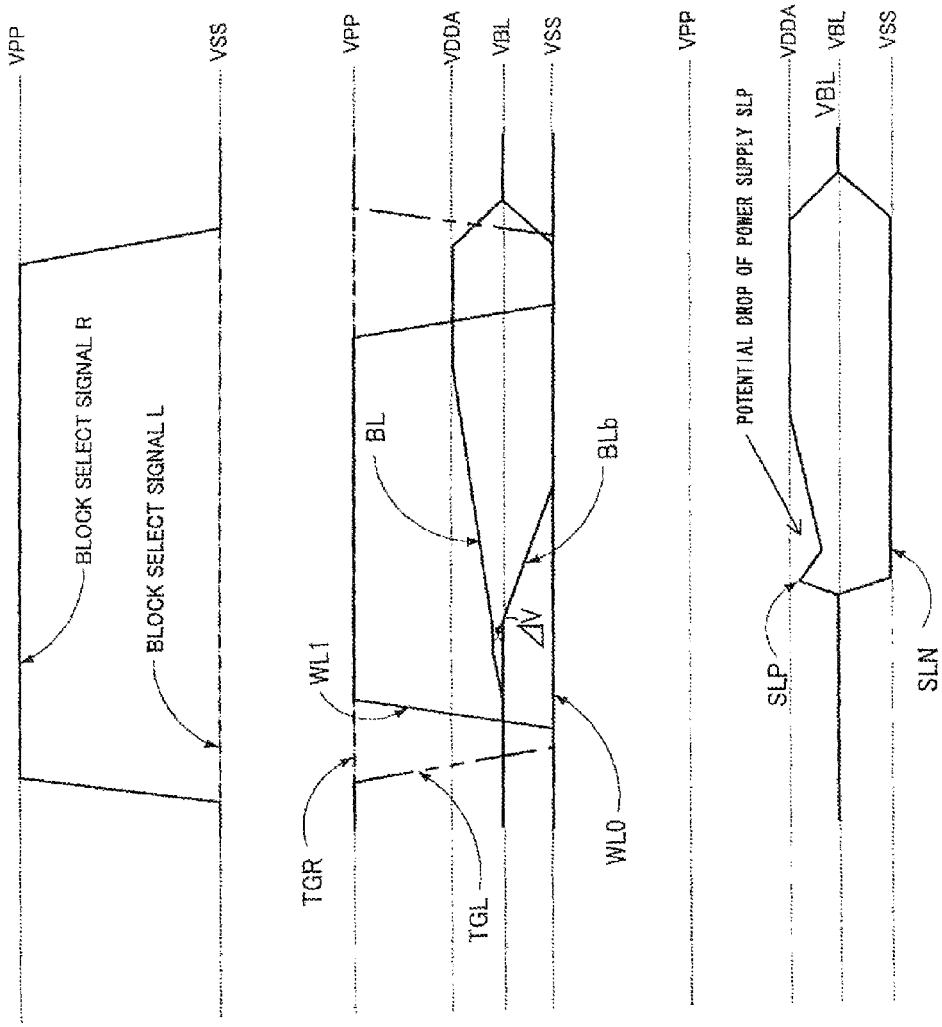
FIG. 2 is a time chart showing the operational waveforms in the conventional circuit structure.
Figure 3:
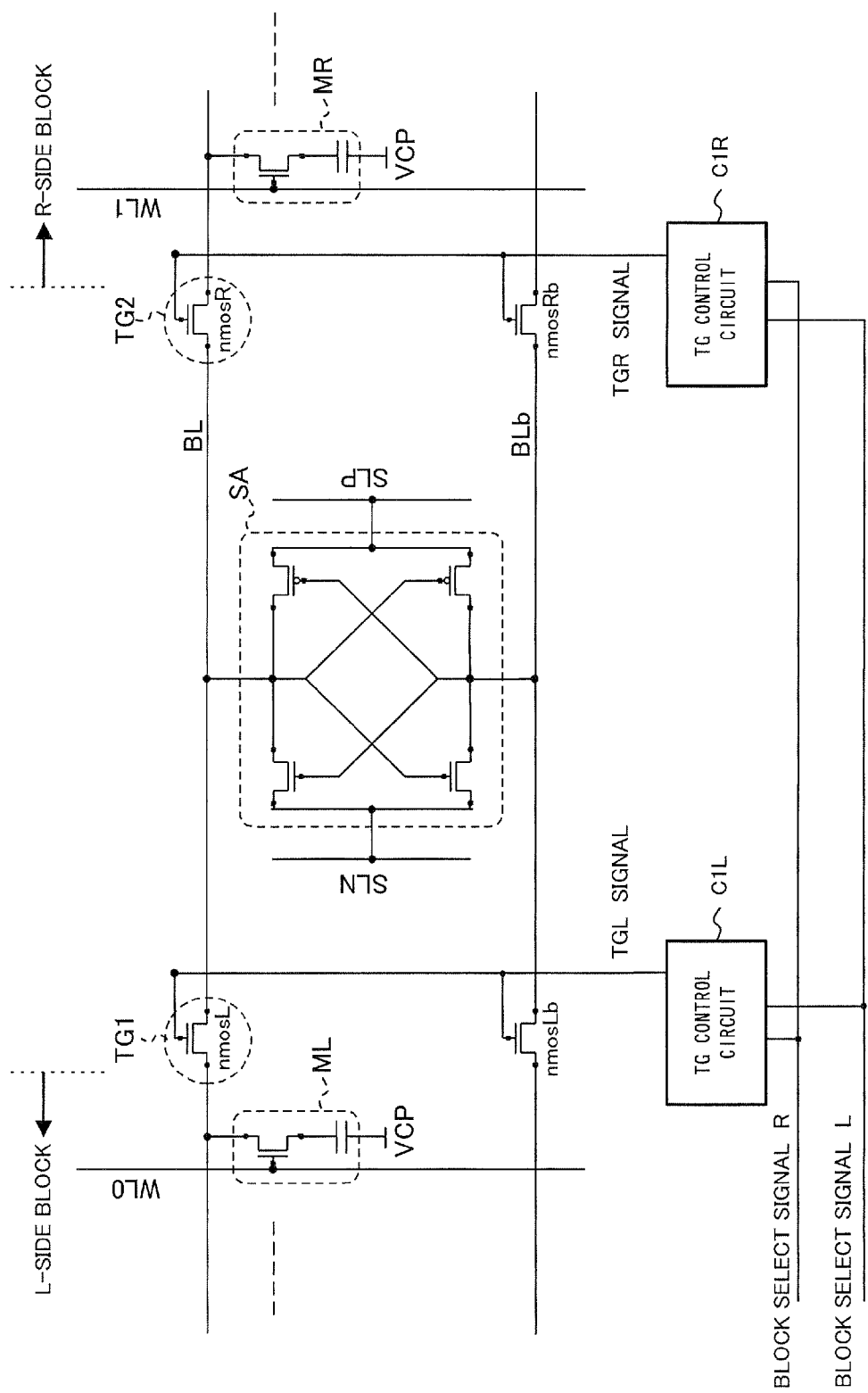
FIG. 3 is a block diagram showing the circuit structure of the semiconductor storage device according to the first embodiment of the present invention.

FIG. 3 shows the circuit structure of the semiconductor storage device according to the first embodiment of the present invention. The semiconductor storage device includes memory cells ML and MR that are positioned at the intersections of a plurality of word lines WL0 and WLn with pairs of bit lines composed of two bit lines BL and BLb. The word lines WL0 and WLn are control signal lines for selecting a row, and the bit line pair composed of the bit lines BL and BLb is a control signal line for selecting a column. A shared sense amplifier SA is connected between the bit lines BL and BLb, and charging and discharging between the bit lines BL and BLb are performed according to a voltage fed from sense amplifier power supplies SLN and SLP.

The bit line BL connected to the sense amplifier SA extends to the word line WL0 via a transistor nmosL, and to the word line WL1 via a transistor nmosR. The transistor nmosL is turned on and off according to a TGL signal generated by a TG control circuit C1L according to block select signals L and R. The transistor nmosR is turned on and off according to a TGR signal generated by a TG control circuit C1R in accordance with block select signals L and R. The bit line BLb connected to the sense amplifier SA extends to the word line WL0 via a transistor nmosLb, and to the word line WL1 via the transistor nmosR. The transistor nmosLb is turned on and off according to the TGL signal. The transistor nmosRb is turned on and off according to the TGR signal.

The transistor nmosL and the transistor nmosR correspond to switches as constituent elements of the present invention, and function as switches in which the degree of conduction can be continuously varied. These switches are in the ON state when the degree of conduction is changed to the highest practical degree, and are in the OFF state when the degree of conduction is changed to the lowest degree.

Each of the block select signal L and the block select signal R is a signal generated according to an access request signal inputted from the outside to request reading or writing. The block select signal L is a signal indicating the selection of the L-side block that includes the memory cell ML connected to the word line WL0 extending to the left in the drawing across the sense amplifier SA, and the block select signal R is a signal indicating the selection of the R-side block that includes the memory cell MR connected to the word line WL1 on the right side of the drawing across the sense amplifier SA. For example, in a case in which the VPP ("high") level is inputted to the block select signal R, the TGL signal then reaches the VSS level, the transistor nmosL and the transistor nmosLb are turned off, the bit line BL and the bit line BLb on the side of the word line WL0 are cut off from the sense amplifier SA, the TGR signal reaches the VPP level, the transistor nmosR and the transistor nmosRb are turned on, and the bit line BL and the bit line BLb on the side of the word line WL1 are connected to the sense amplifier SA.

The bit line BL that extends across the transistor nmosL to the opposite side from the sense amplifier SA is connected to a power supply VCP for feeding a memory cell plate voltage via the memory cell ML. The memory cell ML is a capacitor-type cell that includes an NMOS transistor that is turned on by the word line WL0 reaching the VPP level, and a bit cell capacitor for carrying bit information. In the same manner, the bit line BL that extends across the transistor nmosR to the opposite side from the sense amplifier SA is connected to the power supply VCP via the memory cell MR. The memory cell MR includes an NMOS transistor that is turned on by the word line WL1 reaching the VPP level, and a bit cell capacitor for carrying bit information.

For example, when the VPP level is inputted to the word line WL1, a charge is discharged from the memory cell MR to the bit line BL, and a potential difference ΔV is outputted between the bit line BL and the bit line BLb. The sense amplifier SA is activated by the sense amplifier power supply SLP reaching the VDDA level, and the sense amplifier power supply SLN reaching the VSS level after ΔV is outputted, whereby the sense amplifier SA initiates a sensing operation and amplifies the potential difference ΔV. Reading or writing is performed after the bit line BL reaches the VDDA level and the bit line BLb reaches the VSS level. The power supply SLP then changes to an open state from VDDA, the power supply SLN changes to an open state from VSS, and the sensing operation is stopped in a state in which a charge is still retained in the memory cell MR by the input of the VSS level to the word line WL1. The TGL signal is changed to the VPP level by the input of the VSS level to the block select signal R. Lastly, the potentials of the bit line BL, the bit line BLb, the power supply SLP, and the power supply SLN are set to the potential of a power supply VBL by an equalization operation.

In the description given above, the power supply VPP is a voltage-raised power supply for the word lines, the power supply VDDA is a voltage-lowered power supply for an array, and the power supply VSS is a power supply for applying a ground potential. The power supply VBL is a power supply for bit line equalization, and the power supply VCP is a memory cell plate power supply. The voltages of the power supply VBL and the power supply VCP are both set to half the voltage of the VDDA level.

The circuit structure shown in FIG. 3 is simplified to facilitate the description, and the semiconductor storage device according to the present invention is usually implemented as a memory cell array that includes numerous memory cells in which an array structure is formed by numerous word lines and numerous bit line pairs.

Figure 4:
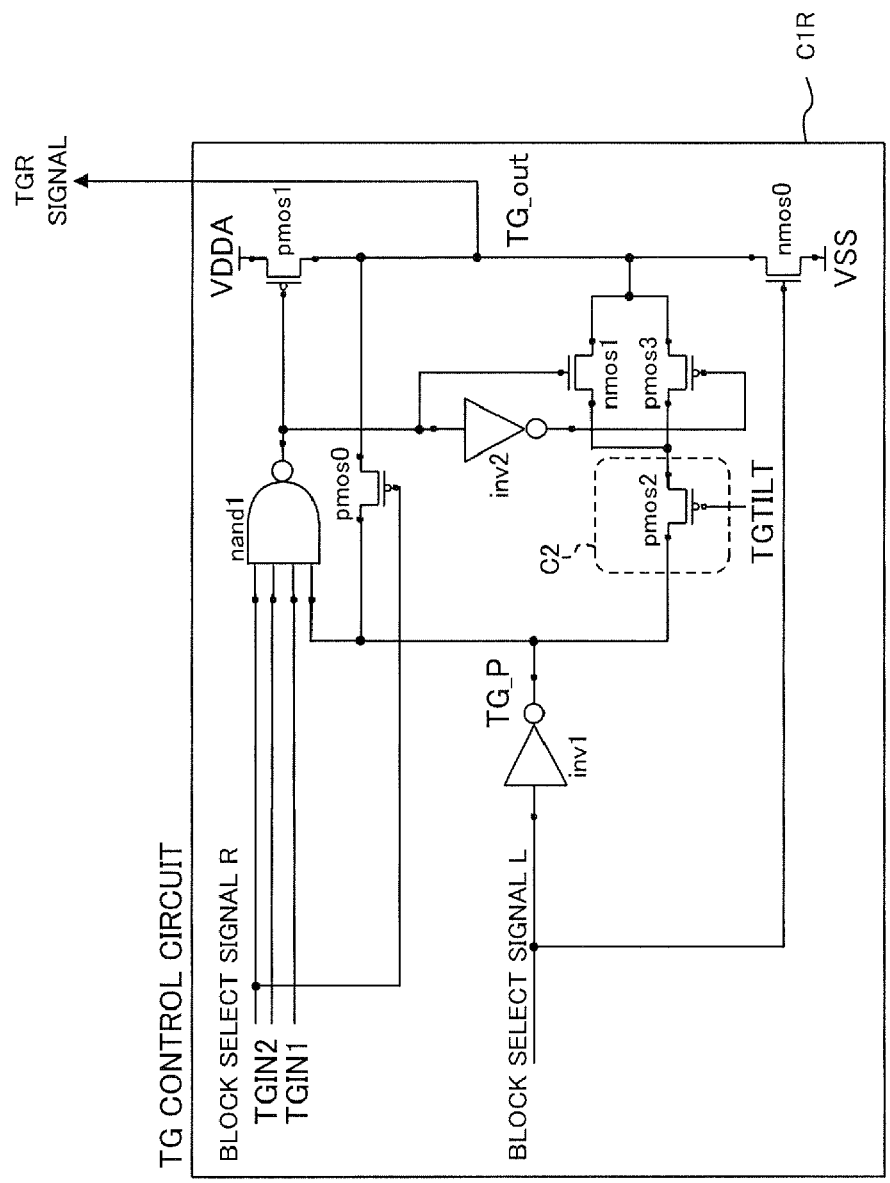
FIG. 4 is a block diagram showing the detailed structure of the TG control circuit shown in FIG. 3.

FIG. 4 shows the detailed structure of the TG control circuit shown in FIG. 3. The TG control circuit C1R is a circuit for controlling the TGR signal. The TG control circuit C1L is a circuit for controlling the TGL signal. The TG control circuits C1R and C1L have the same circuit structure except for the substitution of the block select signal L and the block select signal R. Therefore, only the TG control circuit C1R will be described below.

The TG control circuit C1R is a circuit for controlling the block select signal R inputted from the outside, and controlling the TGR signal in accordance with the potentials of a TGIN2 terminal and a TGIN1 terminal, and is a portion corresponding to the conventional circuit for inverting the block select signal R through an inversion circuit and outputting the inverted signal as a TGR signal.

The block select signal R is inputted to a NAND circuit nand1. The potentials of the TGIN2 terminal, the TGIN1 terminal, and a TG_P terminal are also inputted to the NAND circuit nand1. The output of the NAND circuit nand1 is inputted to the gate of a transistor pmos1. The TG_P terminal is connected to a TG_out terminal via a transistor pmos0. The block select signal R is inputted to the gate of the transistor pmos0. A control signal for presenting the timing at which the TGR signal is lowered to the VDDA level is fed to the TGIN1 terminal. A control signal for presenting the timing at which the TGR signal lowered to the VDDA level begins to be restored to the VPP level is fed to the TGIN2 terminal.

The block select signal L is inputted to an inversion circuit inv1, and to the gate of a transistor nmos0. The output (VPP/VSS level) of the inversion circuit inv1 is connected to the TG_P terminal, and the TG_P terminal is connected to the NAND circuit nand1 and the transistor pmos1 as described above, and to one side of a transistor pmos2. The other side of the transistor pmos2 is connected to one side of a transistor nmos1 and transistor pmos3, which are connected in parallel. The other side of the transistor nmos1 and transistor pmos3 is connected to the TG_out terminal. The output of the NAND circuit nand1 is connected to the gate of the transistor nmos1, and the output of the NAND circuit nand1 is connected to the gate of the transistor pmos3 via an inversion circuit inv2.

The transistor pmos2 constitutes a TG signal transition speed control circuit C2, and a TGTILT signal is inputted to the gate thereof the voltage level of the TGTILT signal determines the slope at which the TGR signal is gradually brought to the VPP level. Consequently, this voltage level must be adjusted to the appropriate value according to the actual semiconductor storage device to which the present invention is applied. An NMOS transistor may be used instead of the PMOS transistor pmos2.

The transistor pmos1 and the transistor nmos0 are connected in series via the TG_out terminal between the power supply VDDA and the power supply VSS, and the TGR signal is outputted from the TG_out terminal.

Figure 5:
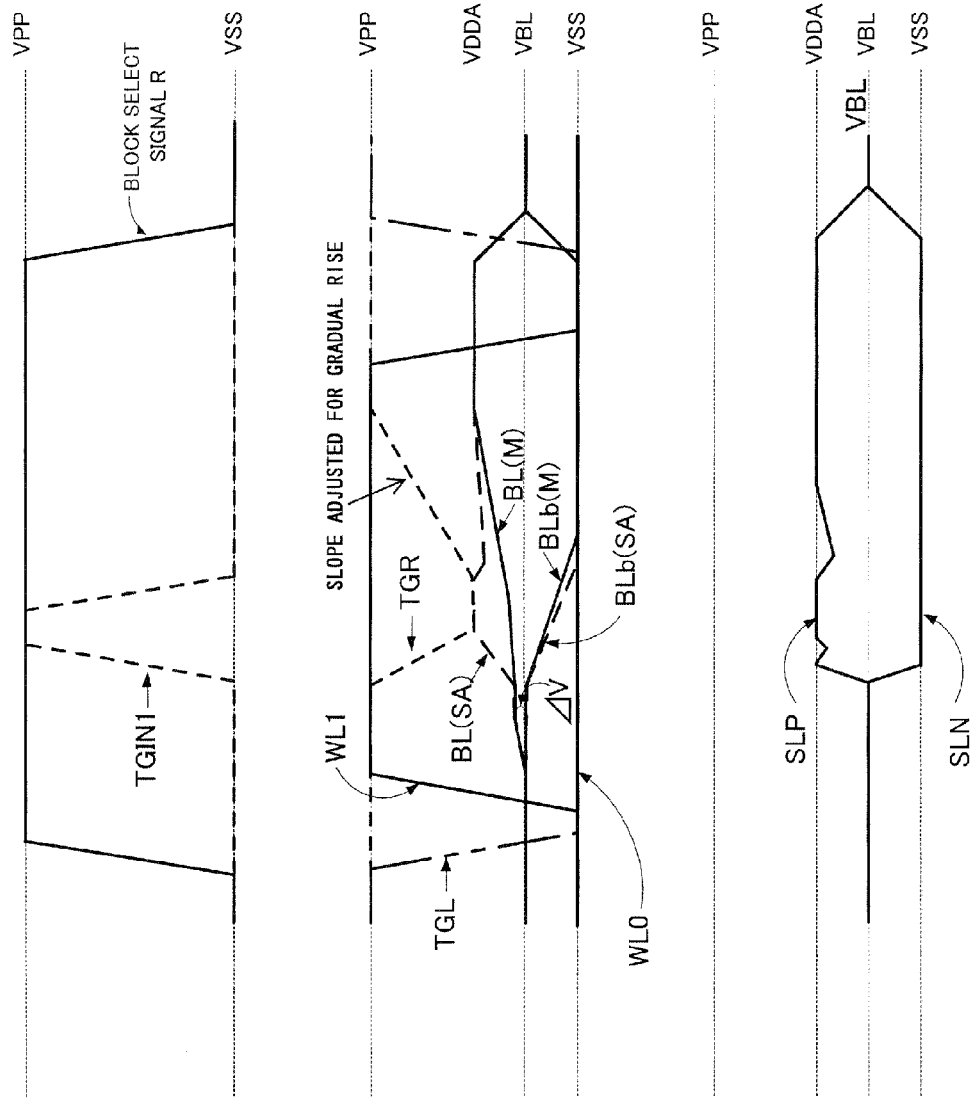
FIG. 5 is a time chart showing the operational waveforms in the first embodiment.

FIG. 5 shows the operational waveforms in the first embodiment. Time is indicated on the horizontal axis, and the vertical axis indicates the variations of potential of the inputted block select signal, TGR signal, and other control signals, and also the variations of potential of the power supply SLP and the like that are obtained according to the control signals. The operation of the first embodiment will be described hereinafter with reference to FIG. 5. The symbol "(M)" indicates a memory-side potential across a transistor provided to a midportion of a bit line, and the symbol "(SA)" indicates a potential on the side of the sense amplifier.

It is assumed that the block that includes the memory cell MR is selected. The VSS level is inputted to the block select signal L, and the VPP level is inputted to the block select signal R. The TGL signal is thereby first brought to the VSS level, and the TGR signal is retained at the VPP level. The potential of the TG_P terminal is also retained at the VPP level.

The VPP level is then inputted to the word line WL1, whereby a charge is discharged from the memory cell MR, and a potential difference ΔV is outputted between the bit line BL and the bit line BLb. The sense amplifier SA is activated by the power supplies SLP and SLN, and a sensing operation is initiated. At substantially the same time as the sensing operation is initiated, the VPP level is inputted to the TGIN1 terminal, the NAND circuit nand1 outputs the VSS level, the transistor pmos1 turns on, and the TGR signal reaches the VDDA level in a short transition time. The TGR signal reaches the VDDA level, and the TGL signal reaches the VSS level, whereby the potential of the bit line BL confined within the transfer gates TG1 and TG2 relative to the bit line BLb disposed in the memory cell MR is amplified by the sensing operation. The VSS level is then inputted to the TGIN1 terminal, whereby the NAND circuit nand1 outputs the VPP level. The transistor nmos1 and transistor pmos3 receiving the VPP level and functioning as switches are turned on, the current is fed to the TGR signal line via the transistor pmos2 that acts as a resistor, the potential of the TGR signal gradually reaches the VPP level, and the potential of the bit line BL on the side of the memory cell MR across the transfer gate TG2 is also amplified by the sensing operation. The slope of the TGR signal potential at this time depends on the electric current+ a (alpha) of the transistor pmos2. The electric current can be controlled by size adjustment of such characteristics as the gate voltage or gate width of the transistor pmos2.

The sense amplifier SA then performs a sensing operation on the basis of the sense amplifier power supply SLP that is maintained at the VDDA level and is prevented from dropping, and on the basis of the sense amplifier power supply SLN at the VSS level, and amplifies the potential difference ΔV. Reading or writing is performed after the bit line BL reaches the VDDA level and the bit line BLb reaches the VSS level. The VSS level is then inputted to the word line WL1, whereby the sensing operation is stopped in the state in which a charge is still retained in the memory cell MR. The TGL signal changes to the VPP level by the input of the VSS level to the block select signal R. Lastly, the potentials of the bit line BL, the bit line BLb, the power supply SLP, and the power supply SLN are set to the potential of the power supply VBL by an equalization operation.

In the first embodiment described above, the TGR signal is set to the VDDA level equal to the power supply of the sense amplifier when sense latching is initiated, whereby the transistor nmosRb remains on. However, the gate potential of the transistor nmosR is set to VDDA−Vt, and the transistor nmosRb functions as a switch in which the degree of conduction can continuously vary between the ON state and the OFF state according to slight fluctuations in the gate potential. Therefore, none of the load capacitance of the bit line BL on the side of the memory cell MR is applied to the sense amplifier, and the bit line BL on the side of the sense amplifier SA is rapidly amplified to the VDDA level. The potential of the TGR signal then gradually reaches the VPP level, whereby the load capacitance of the bit line BL on the side of the memory cell MR is gradually applied to the sense amplifier.

Since the voltage of the sense amplifier power supply SLP is usually established by internally lowering the external power supply voltage, it is impossible to instantaneously respond to a sudden load increase. By applying the present invention, voltage drops are kept small by allowing a primary small consumption current to flow by performing charging and discharging only on the side of the sense amplifier SA and only at the start of sense latching. Upon subsequently receiving the drop, the sense amplifier power supply SLP responds and restores the voltage level. The sense amplifier and the memory cell array are gradually connected as the voltage level is restored, and a secondary large consumption current created by the charging and discharging of the bit line BL on the memory cell side is equalized and allowed to flow. Sudden drops in the voltage level of the sense amplifier power supply are thereby mitigated, and, as a result, less time (RAS-CAS delay time) is required to amplify the potential difference ΔV between the bit line BL and the bit line BLb.

The Second Embodiment

Figure 6:
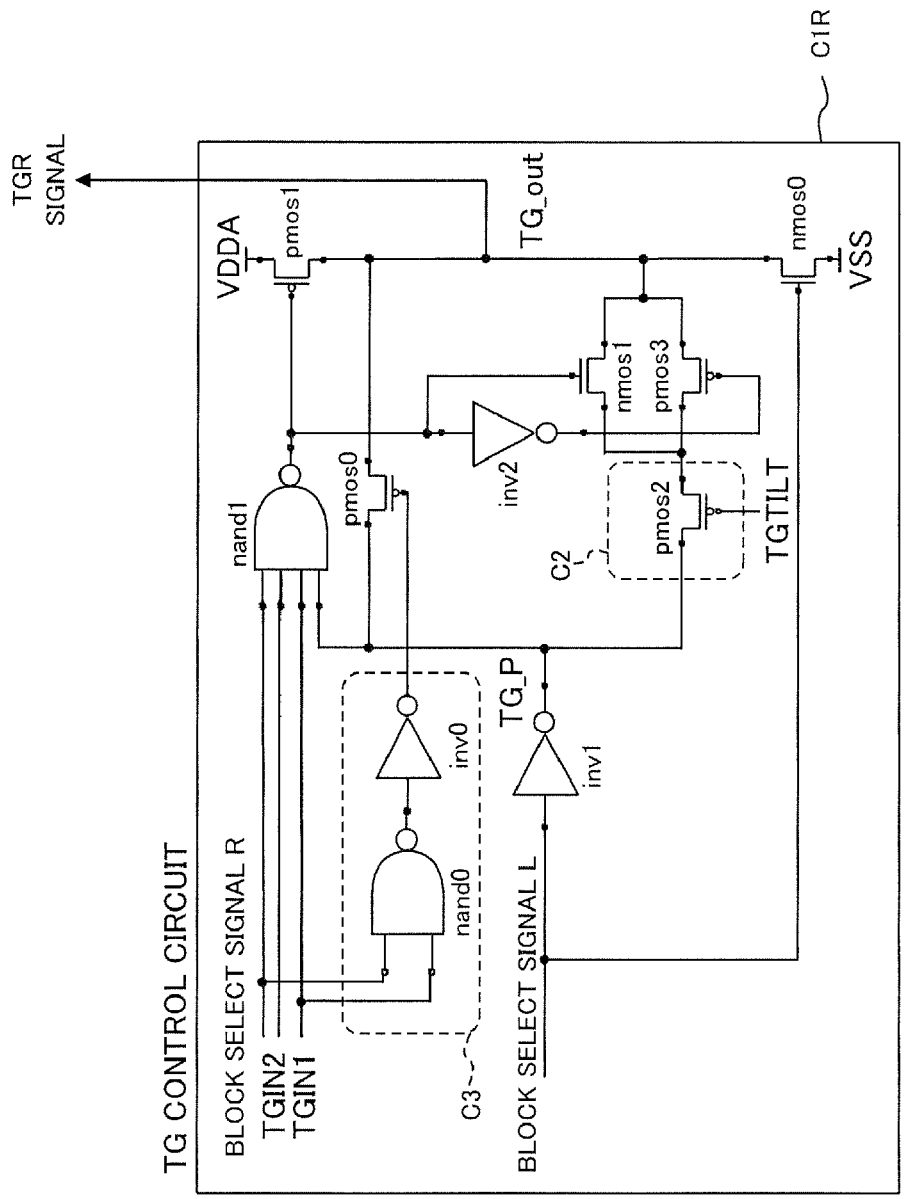
FIG. 6 is a block diagram showing the detailed structure of the TG control circuit in the semiconductor storage device according to the second embodiment of the present invention.

FIG. 6 shows the circuit structure of the semiconductor storage device according to the second embodiment of the present invention. The second embodiment has basically the same configuration as the first embodiment, except that a TG signal transition time control circuit is added in the structure of the TG control circuit. Only the TG signal transition time control circuit will be described below.

As shown in FIG. 6, the TG signal transition time control circuit C3 is composed of a NAND circuit nand0 and an inversion circuit inv0. The block select signal R and the signal of the TGIN1 terminal are inputted to the NAND circuit nand0, the output of the NAND circuit nand0 is inputted to the inversion circuit inv0, and the output of the inversion circuit inv0 is inputted to the gate of the transistor pmos0.

Figure 7:
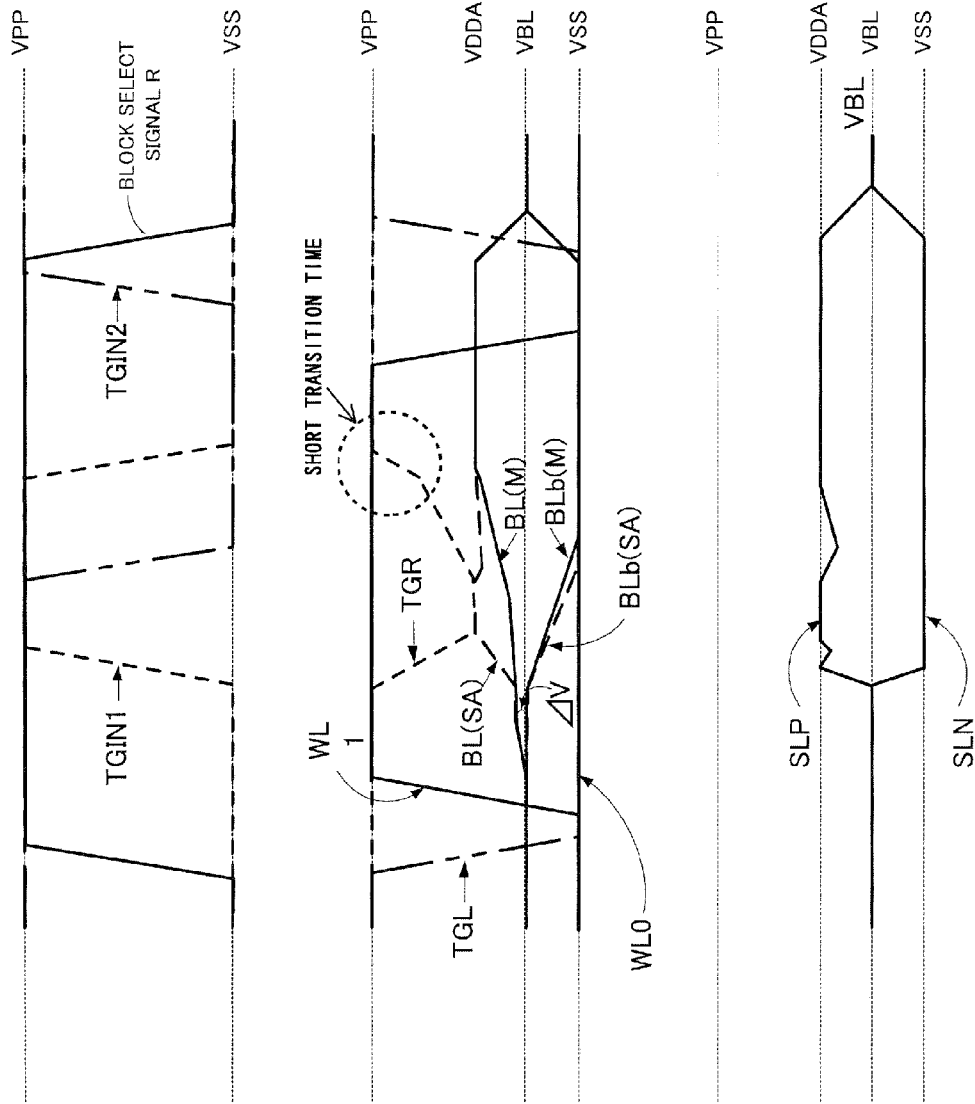
FIG. 7 is a time chart showing the operational waveforms in the second embodiment.

FIG. 7 is a chart showing the operational waveforms in the second embodiment. Time is indicated on the horizontal axis, and the vertical axis indicates the variations of potential of the inputted block select signal, TGR signal, and other control signals, and also the variations of potential of the power supply SLP and the like, that are obtained according to the control signals. The operation of the second embodiment will be described below with reference to FIG. 7.

It is assumed that the block that includes the memory cell MR is selected. The VSS level is inputted to the block select signal L, and the VPP level is inputted to the block select signal R. The VPP level is then inputted to the word line WL1, whereby a charge is discharged from the memory cell MR, and a potential difference ΔV is outputted between the bit line BL and the bit line BLb. The sense amplifier SA is activated by the power supplies SLP and SLN, and a sensing operation is initiated. At substantially the same time as the sensing operation is initiated, the VPP level is inputted to the TGIN1 terminal, and the TGR signal reaches the VDDA level in a short transition time. The VSS level is then inputted to the TGIN2 terminal whose initial state was the VPP level, and the potential of the TGR signal is thereby gradually increased to the VPP level. The abovementioned operations are the same as in the first embodiment.

During the gradual increase of the potential of the TGR signal, the TG signal transition time control circuit C3 receives the block select signal R and the input of the signal of the TGIN1 terminal, and outputs the VPP level. The transistor pmos0 is in the OFF state. Along the way of this process, the VSS level is inputted to the TGIN1 terminal that was formerly at the VPP level. The nand1 receiving this input outputs the VPP, and the TG signal transition time control circuit C3 outputs the VSS level. The transistor pmos1 is thereby turned off, the transistor pmos0 is turned on, the VPP level of the TG_P terminal is short-circuited by the line of the TGR signal, and the potential of the TGR signal reaches the VPP level in a short transition time. Subsequent operations are the same as in the first embodiment.

In the second embodiment described above, the bit line BL approaches the VDDA level, and a determination is made that the drop in the sense amplifier power supply SLA is small, at which time the TGR signal is brought to the VPP level in a short transition time, and the sense amplifier SA and the memory cell MR are completely switched on in a state in which the TGR signal is gradually brought to the VPP level. The potential of the bit line BL is thereby amplified without excessively limiting the current supply to the bit line BL on the memory cell side, and the time (RAS active time) required for amplification is therefore further reduced.

The Third Embodiment

Figure 8:
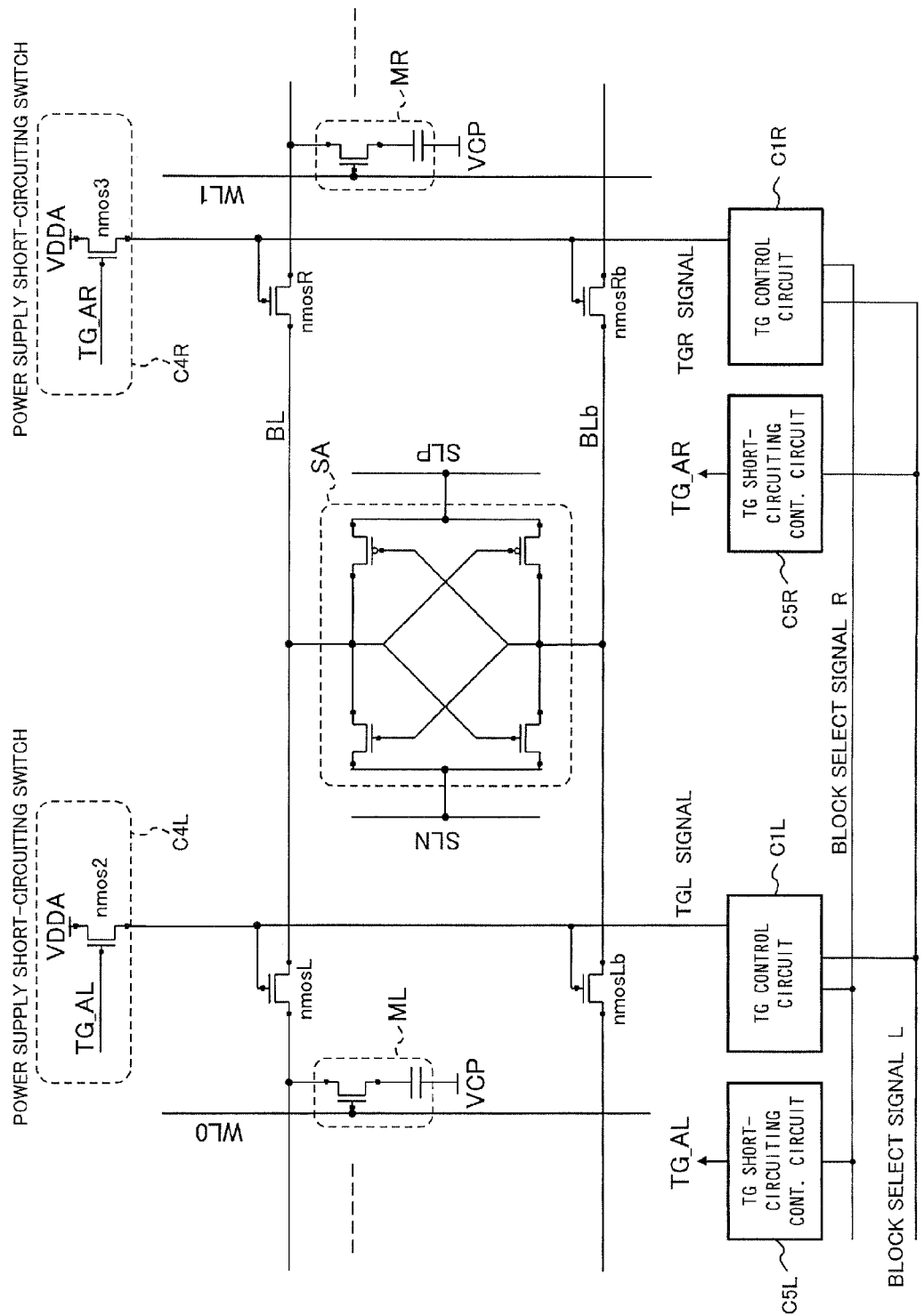
FIG. 8 is a block diagram showing the circuit structure of the semiconductor storage device according to the third embodiment of the present invention.

FIG. 8 shows the circuit structure of the semiconductor storage device according to the third embodiment of the present invention. The third embodiment has basically the same configuration as the first or second embodiment, except that a power supply short-circuiting switch and a TG short-circuiting control circuit are added. Therefore, only the power supply short-circuiting switch and the TG short-circuiting control circuit will be described below.

As shown in FIG. 8, a power supply short-circuiting switch C4L is connected to the TGL signal line. In the power supply short-circuiting switch C4L, one side of a transistor nmos2 is connected to the TGL signal line, and the other side of the transistor nmos2 is connected to the power supply VDDA, which is an array voltage reduction power supply. In the same manner, the power supply short-circuiting switch C4R is connected to the TGR signal line. In the power supply short-circuiting switch C4R, one side of a transistor nmos3 is connected to the TGR signal line, and the other side of the transistor nmos3 is connected to the power supply VDDA, which is an array voltage reduction power supply. The power supply short-circuiting switch C4L and the power supply short-circuiting switch C4R are each preferably provided in the vicinity of the sense amplifier. Control delays caused by wiring resistance or wiring capacitance can thereby be minimized.

The outputs of TG short-circuiting control circuits C5L and C5R are connected to the TG_AL terminal and the TG_AR terminal, respectively, wherein the TG_AL terminal and the TG_AR terminal are the terminals for the gates of the transistor nmos2 and the transistor nmos3, respectively.

Figure 9:
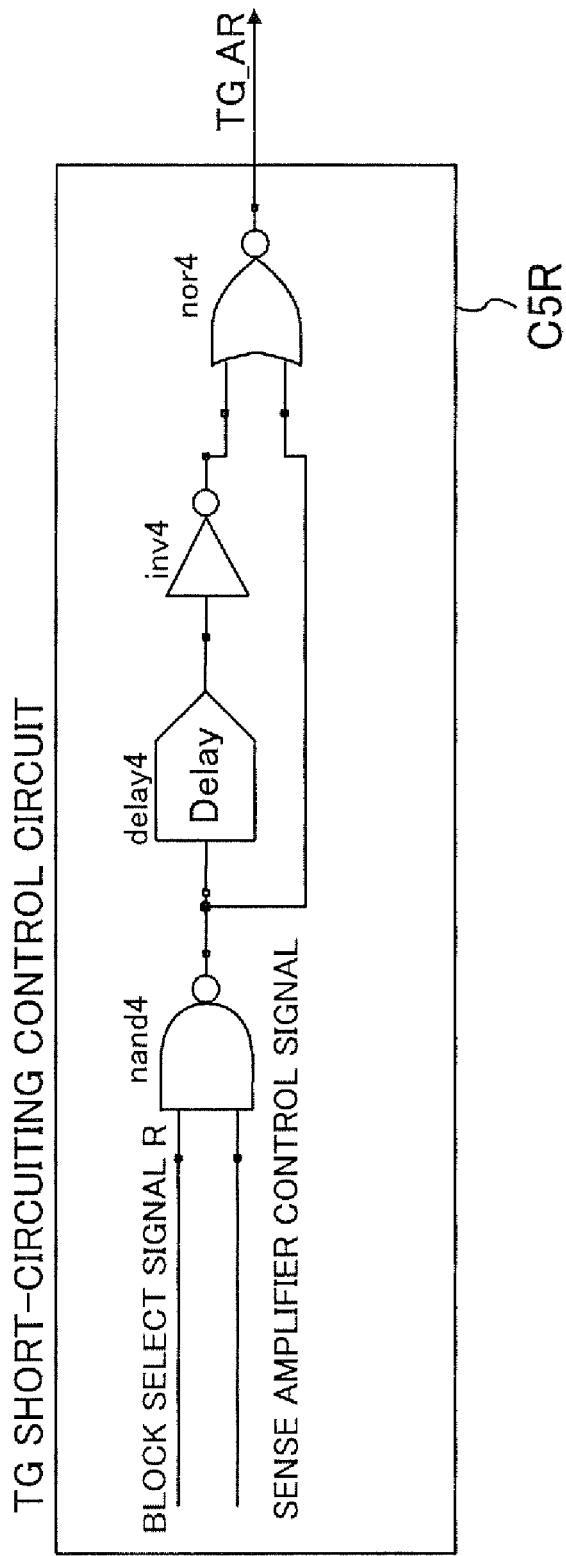
FIG. 9 is a block diagram showing the detailed structure of the TG short-circuiting control circuit shown in FIG. 8.

FIG. 9 shows the detailed structure of one of the TG short-circuiting control circuits shown in FIG. 8. The TG short-circuiting control circuits C5L and C5R shown in FIG. 8 have basically the same circuit structure except for the substitution of the block select signal L and the block select signal R. Therefore, only the TG short-circuiting control circuit C5R will be described below.

The TG short-circuiting control circuit C5R is a circuit for generating a "high" (VPP level) pulse in accordance with the block select signal R and a sense amplifier control signal. The circuit is composed of a NAND circuit nand4, a delay circuit delay4, an inversion circuit inv4, and a NOR circuit nor4. The block select signal R and the sense amplifier control signal are inputted to the NAND circuit nand4, and the output of the NAND circuit nand4 is inputted to the delay circuit delay4 and the NOR circuit nor4. The output of the delay circuit delay4 is inputted to the inversion circuit inv4. The output of the inversion circuit inv4 is inputted to the NOR circuit nor4 together with the output of the NAND circuit nand4. The output of the inversion circuit inv4 is fed to the TG_AR terminal shown in FIG. 8.

Figure 10:
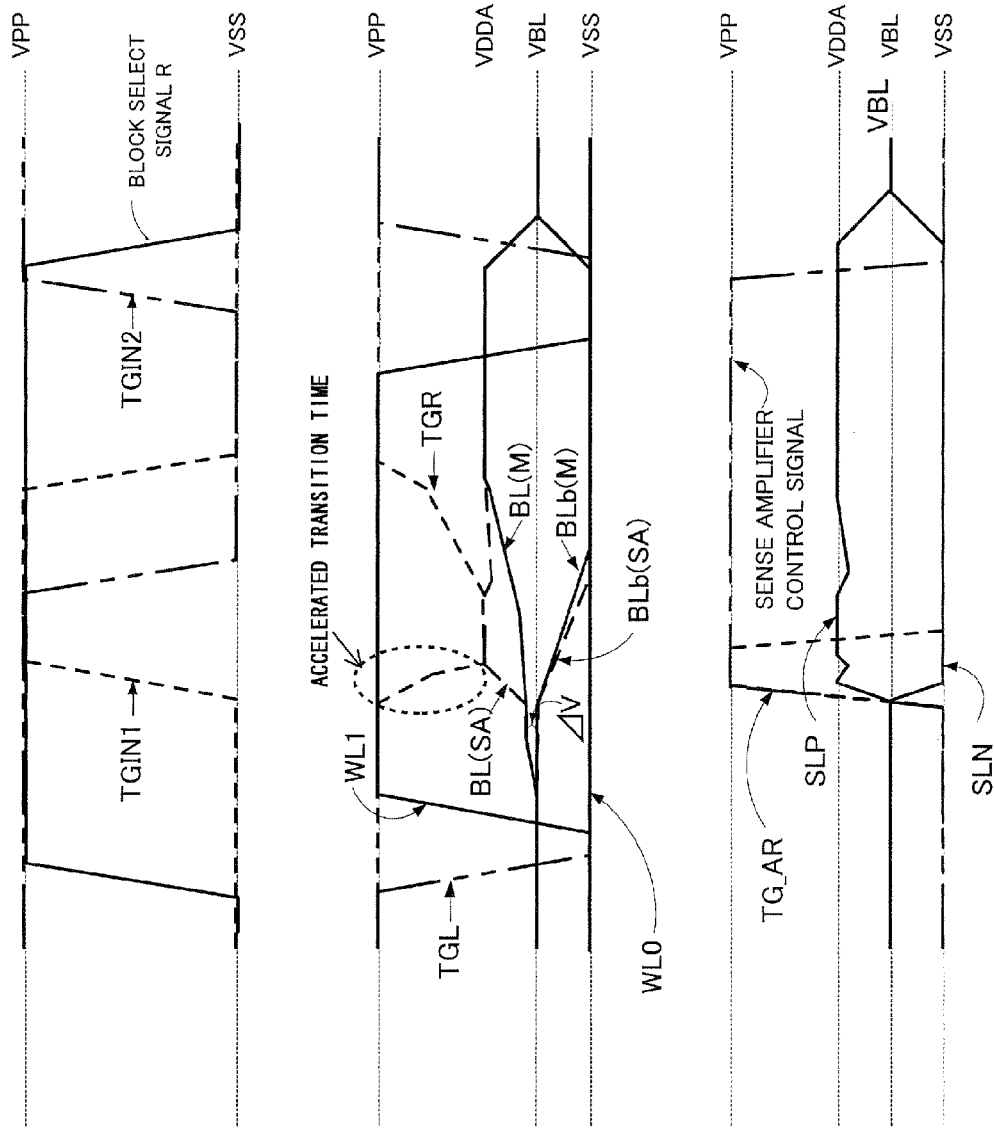
FIG. 10 is a time chart showing the operational waveforms in the third embodiment.

FIG. 10 is a chart showing the operational waveforms in the third embodiment. Time is indicated on the horizontal axis, and the vertical axis indicates the variations of potential of the inputted block select signal, TGR signal, and other control signals, and also the variations of potential of the power supply SLP and the like, that are obtained according to the control signals. The operation of the third embodiment will be described below with reference to FIG. 10.

The operation of the third embodiment is the same as in the first or second embodiment until the time at which the sensing operation is initiated. When the sensing operation is initiated, the VPP level is inputted as the block select signal R, and the VPP level is inputted as the sense amplifier control signal to the TG short-circuiting control circuit C5R. A "high" (VPP level) pulse is thereby inputted via the TG_AR terminal to the gate of the transistor nmos3, and the TGR signal line and the power supply VDDA are instantaneously short-circuited. The TGR signal is instantaneously reduced to the VDDA level by this short-circuit operation, and the transition time is accelerated. The subsequent operations are the same as in the first or second embodiment.

In the third embodiment described above, the time required for the TGR signal to be reduced from the VPP level to the VDDA level is further reduced by providing the power supply short-circuiting switch and the TG short-circuiting control circuit. The amplification time (RAS-CAS delay time) of the bit line BL on the side of the sense amplifier is thereby reduced. The TGIN2 terminal in the case of the first or second embodiment can also be set to "low" (VSS level), the gradual bringing of the TGR signal to the VPP level can be initiated earlier, and the overall amplification time of the bit line BL can be further reduced.

The structure adopted in the third embodiment is not limited to the mode in which joint use is made with the structure adopted in the first or second embodiment, and may also be applied to a conventional mode that does not include a structure in which the transfer gate is merely switched off only at the time of sense latching, and is thereby gradually placed in the ON state thereafter.

Modes were described in the embodiments above in which a shared sense amplifier was used as the sense amplifier, but the present invention can also be applied, through the use of the same circuit, to a mode that uses a one-side sense amplifier.

This application is based on a Japanese Patent Application No. 2007-193649 which is hereby incorporated by reference.

What is claimed is:

1. A semiconductor storage device comprising:

at least one bit line;

a plurality of memory cells connected to said bit line and each supplying a holding potential of the memory cells to the bit line; and a sense amplifier connected to said bit line, for amplifying said holding potential and feeding the amplified holding potential to said bit line; said semiconductor storage device further comprising:

a switch provided to said bit line between said memory cells and said sense amplifier and capable of continuously varying a degree of conduction; and a switch control circuit for varying the degree of conduction of said switch in accordance with an access request signal;

wherein said switch control circuit causes the holding potential of said memory cells to be transmitted to said sense amplifier via said bit line by increasing said degree of conduction, then decreases said degree of conduction and gradually increases said degree of conduction as time elapses while said sense amplifier amplifies the transmitted holding voltage and feeds the amplified holding voltage to said bit line.

2. The semiconductor storage device according to claim 1, wherein said switch control circuit rapidly increases said degree of conduction along the way of the gradual increase of said degree of conduction.

3. The semiconductor storage device according to claim 1, wherein said switch is a transistor in which the degree of conduction can be varied according to a gate-inputted potential, and further includes a short-circuiting switch for short-circuiting the gate of said transistor and a power supply line for supplying a potential sufficient to reduce said degree of conduction.

* * * * *